United States Patent [19]

Heinz et al.

[11] 4,016,502
[45] Apr. 5, 1977

[54] DYNAMIC RANGE EXTENDER CIRCUIT FOR PREAMPLIFIER

[75] Inventors: Harro K. Heinz, Deerfield; Bernard S. Cahill, Mount Prospect, both of Ill.

[73] Assignee: Rauland-Borg Corporation, Chicago, Ill.

[22] Filed: June 18, 1976

[21] Appl. No.: 697,441

[52] U.S. Cl. .............................. 330/29; 179/1 VL; 330/31
[51] Int. Cl.² ........................................ H03G 3/30
[58] Field of Search ............. 179/1 VL; 330/29, 31, 330/135

[56] References Cited
UNITED STATES PATENTS

| | | | |
|---|---|---|---|
| 2,997,656 | 8/1961 | Barlow | 330/29 |
| 3,980,965 | 9/1976 | Cunningham | 330/31 |

*Primary Examiner*—Rudolph V. Rolinec
*Assistant Examiner*—Lawrence J. Dahl
*Attorney, Agent, or Firm*—Leydig, Voit, Osann, Mayer & Holt, Ltd.

[57] ABSTRACT

An input amplifier stage for a microphone which includes a transistor having a load circuit including a load resistor and an emitter resistor. In a preferred embodiment, using a transistor of the NPN type, a volume control potentiometer is provided having a first terminal which is coupled to the emitter and a second terminal which is coupled to the output of the stage, with the wiper being grounded so that (a) when the wiper is adjacent the emitter, the emitter resistor is effectively shunted by low resistance thereby increasing the gain of the transistor stage while leaving the output terminal substantially free of shunting effect for maximizing the output signal, and so that (b) when the wiper is adjacent the output terminal, the stage output terminal is effectively shunted by a low resistance while leaving the emitter resistor substantially free of shunting effect for decreasing the gain of the stage and minimizing the output signal. A limiting resistor and capacitor are effectively interposed in series with the first terminal of the potentiometer to limit the maximum gain of the stage to a reasonable level and for preventing noise from being generated by the wiper.

10 Claims, 2 Drawing Figures

DYNAMIC RANGE EXTENDER CIRCUIT FOR PREAMPLIFIER

It is conventional to permit an input amplifier stage, or preamplifier, for a microphone to run "wide open", thereby achieving a maximum signal-to-noise ratio, with control of signal volume being secured by a potentiometer at the output of the amplifier stage. This is done on the assumption that the sound level at the microphone will never reach a point which is so great that the microphone signal will overload the stage to cause distortion. In order to reduce the likelihood of overloading the preamplifier in the face of high sound levels, it has been proposed to provide a variable emitter resistor which is ganged with the output level control so that the stage gain is at a maximum when the level control is at its maximum volume setting and so that the stage gain is at a minimum when the level control is at the opposite end of its range. Such an arrangement is disclosed in Audio Engineering Society Preprint 916 (B-3) entitled "A Professional Mixer/Compressor for Remote or Studio Use", presented in May of 1973.

It is a general object of the present invention to simplify and to improve upon the circuit set forth in the Preprint. It is, therefore, an object of the present invention to provide a preamplifier circuit which avoids the necessity for ganged controls and which utilizes a single potentiometer simultaneously as a level control and as a stage gain control. It is a related object to provide a microphone input amplifier circuit in which the wiper of the output level control potentiometer, instead of being connected as an output terminal, is connected to a point of reference, ground in the preferred embodiment, so that one leg of the potentiometer performs a level control function while the other leg of the potentiometer controls the stage gain, with the result that upon turning the potentiometer in one direction, both gain and level are increased and upon turning the potentiometer in the opposite direction, both gain and level are decreased. Accordingly, it is an object to provide a microphone input amplifier stage having a single control potentiometer which covers a greatly expanded dynamic range, thereby insuring maximum amplification with a high signal-to-noise ratio when picking up low level sounds while insuring against overloading of the stage in the face of a "close up" high level sound, for example, as encountered in "rock" solo work.

It is a related object to provide a circuit having simultaneous level and gain control which has means for limiting maximum gain to a reasonable level and which is substantially free of noise, both circuit noise and that which results from wiper movement.

It is a general object of the present invention to provide an improved input amplifier stage which is highly economical, requiring only the reconnection of a level control potentiometer of the general type normally provided so that it performs a dual function, with addition of a single low cost resistor and single capacitor to achieve all of the advantages set forth above. Consequently, it is an object to provide a volume control circuit which may be used universally in amplifying systems, from the cheapest to the most expensive and elaborate.

Other objects and advantages of the invention will become apparent upon reading the attached description and upon reference to the drawings in which.

While the invention has been described in connection with certain preferred embodiments, it will be understood that it is not intended to be limited to the particular embodiments shown but intended, on the contrary, to cover the various alternative and equivalent circuits included within the spirit and scope of the present invention.

Figure 1:
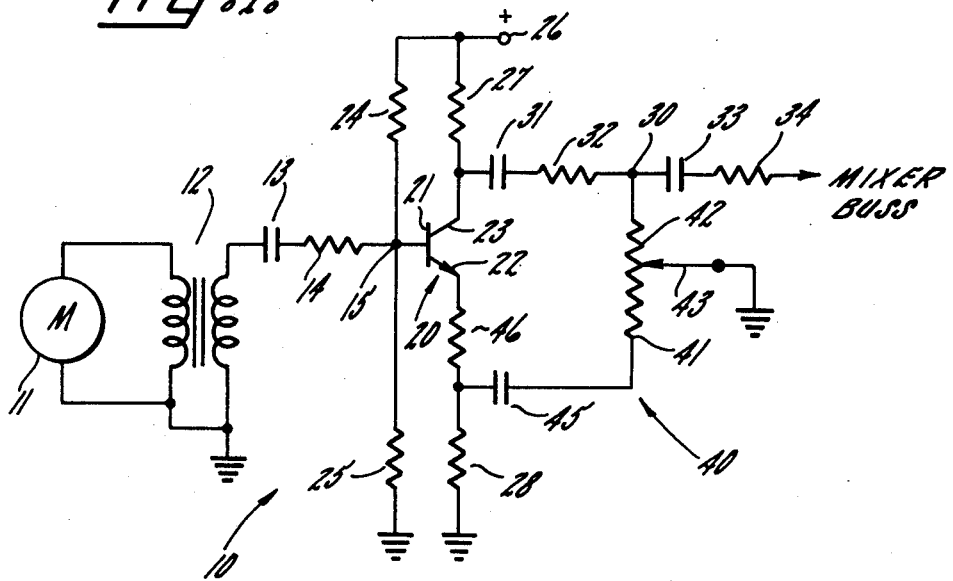
FIG. 1 is a schematic diagram of an input amplifier stage incorporating the present invention.

Turning now to FIG. 1 there is shown an input, or preamplifier, stage 10 for a microphone 11. The microphone is connected through a transformer 12, the secondary of which is coupled via a capacitor 13 and resistor 14 to the stage input terminal 15.

The amplifier stage includes a single transistor 20 having a base 21, emitter 22 and collector 23. The base is biased to a desired operating point by means of a bias voltage divider consisting of resistors 24, 25 which are connected across a voltage source 26 from positive to a reference point, which is ground in the present instance.

The transistor has a load, or output, circuit connected across the source 26 consisting of a load resistor 27 in series with the collector and an emitter, or gain determining, resistor 28 in series with the emitter and the outer end of which is connected to ground. The inner end of the load resistor 27 is coupled to the stage output terminal 30 by a series capacitor 31 and series resistor 32. Interposed between the stage output terminal 30 and the mixer buss is a coupling capacitor 33 and series resistor 34. The capacitors 31, 33 provide d.-c. isolation.

For the purpose of simultaneously controlling signal level and stage gain a potentiometer 40 is provided having a first terminal 41, a second terminal 42, and a wiper 43. The first terminal 41 of the potentiometer is coupled to the inner, or emitter, end of the emitter resistor 28 while the second terminal 42 is coupled to the stage output terminal 30. The wiper 43 of the potentiometer is connected to the point of reference of the current source, namely, ground.

In accordance with one of the important aspects of the invention, a high value capacitor 45 is connected effectively in series with the circuit which includes the first terminal 41 of the potentiometer and the wiper 43 so that it performs a blocking function, preventing direct current from flowing from the transistor through the wiper to ground. By "high value" is meant a capacitance which is sufficiently high so that a low impedance path is provided for the audio signal, a capacitance which may be on the order of, say, 30 μf.

In accordance with one of the more detailed features of the present invention a low value limiting resistor 46 is effectively interposed in series with the first or emitter terminal of the potentiometer thereby to insure that a certain minimum resistance is always in the emitter circuit even when the slider is in its adjacent end positon thereby to limit the maximum circuit gain to a reasonable level.

Typical circuit values which may be utilized in practicing the invention are as follows:

| | |
|---|---|
| Capacitor 13 | 0.47 µf. |
| Resistor 14 | 4.7K ohms |
| Transistor 20 | MPSA18 (B=500,Ic=50µa.) |
| Resistor 24 | 2.2M ohms |
| Resistor 25 | 220K ohms |
| Resistor 27 | 47K ohms |
| Resistor 28 | 4.7K ohms |
| Capacitor 31 | 2.2 µf. |
| Resistor 32 | 4.7K ohms |
| Capacitor 33 | 0.47 µf. |
| Resistor 34 | 1M ohms |
| Potentiometer 40 | 50K ohms |
| Capacitor 45 | 30 µf. |
| Resistor 46 | 180 ohms |

Using "limiting" resistor 46 with a relatively low value of 180 ohms, the maximum gain of the circuit is limited to approximately 112. Changing the resistance to 1000 ohms limits the maximum gain to about 20, which may be sufficient for many applications.

The dual function performed, in the present circuit, by the potentiometer 40, in controlling both level and gain, will be made clear by considering representative settings. Thus when the wiper 43 of the potentiometer is at its lower, or emitter, end, the emitter resistor 28 is effectively shunted out of the circuit so that the effective resistance of the emitter circuit is limited to the neighborhood of 180 ohms resulting in maximum gain. At the same time, the stage output terminal 30 is substantially free of shunting, or voltage dividing, effect, so that substantially all of the output signal developed by the transistor is available at the mixer buss. In short, with the wiper at the lower end of the potentiometer, corresponding to minimum sound level at the microphone, the amplifier stage is not only operated at its condition of highest practical gain but the level control function of the potentiometer is maximum or "wide open".

Conversely where the microphone is subjected to the extremely high sound levels, as in the case of a "rock" soloist operating "close up", the wiper 33 is turned by the control operator to the opposite region of its adjustable range, adjacent the upper terminal 42, at which point the potentiometer serves, simultaneously to reduce signal level and reduce stage gain. The reduction in signal level comes about by the fact that the upper leg of the potentiometer, being connected to the stage output terminal 30, shunts a large proportion of the available signal through the wiper directly to ground, with a large drop in signal voltage occurring in the series output resistor 32. At the same time, the lower leg of the potentiometer, which now has a high resistance, no longer has any appreciable shunting effect with respect to the emitter resistor 28. Consequently the emitter resistor 28, which has a normal relatively high resistance, is fully effective to reduce the gain of the circut to approximately 10, the effective gain being approximately in the ratio of the resistors 27, 28. Since the stage gain is so low, the microphone may be subjected to any practically obtainable sound level without overloading the amplifier stage. The dynamic range is therefore extremely high, i.e., the microphone may be subjected to sound covering a range of 130 dB without any fear of overloading or distortion. It may be noted that a wide dynamic range is achieved using an inexpensive transistor, a transistor which in normal circuitry is relatively limited in dynamic range. Intermediate values of level and gain are proportionately achievable to provide a smooth transition between the potentiometer end points. Preferably, and for maximum convenience of operation, the potentiometer 40 has a taper characteristic which is "beyond logarithmic". In a conventional reverse logarithmic taper the resistance in the legs, at midpoint, is in the ratio of about 10/90. The present potentiometer is preferably tapered to provide a lower resistance ratio, with wiper at midpoint, of 5/95, with the lower value of resistance being in the lower leg of the potentiometer.

Similarly to the potentiometer, the capacitor 45 performs two separate but related functions. In the first place it quiets any noise generated by the adjusting movement of the wiper by reason of the fact that it blocks any flow of direct current through the wiper. The blocking, or isolating, effect also serves to prevent any change in the direct component of current flowing through the transistor load circuit when the potentiometer setting is changed. By keeping the direct component of load current at a low and constant level, the amount of electrical noise generated in the transistor itself is kept at a low level. If desired, the capacitor 45 may be removed from its illustrated position in the circuit and connected between the wiper 43 and ground while still achieving the quieting and blocking function. From the standpoint of function it will be noted that both capacitor 45 and resistor 46 are effectively in series with the wiper 43.

It will be apparent that the advantages of the circuit are obtained at extremely low cost. In addition to utilizing only a single potentiometer, as compared to an expensive potentiometer of the ganged type, the circuit requires only a single added resistor 46 ad a single added capacitor 45, obtained for a few cents from suppliers on an OEM basis.

Figure 2:
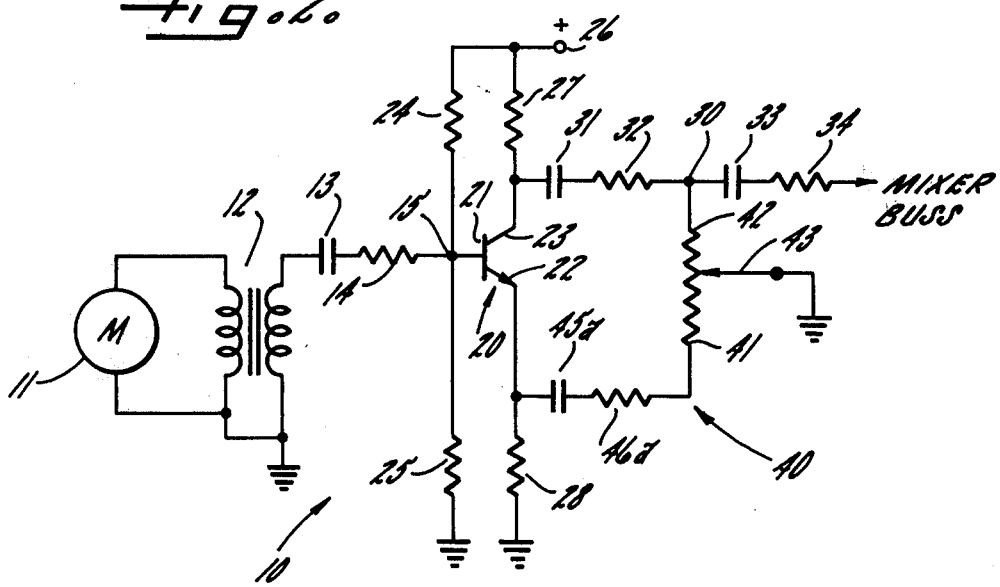
FIG. 2 is a schematic diagram showing an alternate circuit.

While the invention has been described in connection with a preferred embodiment, it will be apparent to one skilled in the art that the invention is not limited to the exact circuit shown in FIG. 1 and that the invention may be practiced using the circuit connections set forth in FIG. 2 in which similar parts are indicated at the same reference numerals with addition of subscript *a* and in which the limiting resistor, here indicated at 46*a*, is connected directly to the lower end (first terminal) of the potentiometer. The circuit of FIG. 2 operates in the same manner as the circuit of FIG. 1, and the only difference is that to achieve such operation the value of the blocking capacitor 45*a* must be somewhat higher than that employed in FIG. 1, for example, 300 µf.

While the invention finds particular utility in a first stage amplifier, or preamplifier, for a microphone, it will be apparent that the circuit may be employed for other specific purposes, that is, wherever a transducer is used having a wide dynamic range and where it is desired to prevent overloading of the amplifier at the upper end of the range.

Also while the invention has been described in connection with an NPN type transistor, the use of which is preferred because of reasons of economy, it will be apparent to one skilled in the art that the invention is equally applicable to transistors of the PNP type, in which case the wiper terminal of the potentiometer is returned to the positive side, rather than to the negative side, of the voltage source. Indeed, the invention may be used with other solid state amplifying devices, such as a field effect transistor, having, in addition to an input circuit, a load circuit which includes a gain-determining resistor which may be effectively and variably shunted by the lower leg of a level-controlling potentiometer.

What is claimed is:

1. In an input amplifier stage for a microphone, the combination comprising a transistor having a base, emitter and collector, a direct current source, means for coupling a microphone to the base, a load circuit including a load resistor in series with the collector and an emitter resistor in series with the emitter, a stage output terminal coupled to the collector, a volume control potentiometer having emitter and output terminals and a wiper, the emitter terminal being coupled to the emitter end of the emitter resistor, the wiper being coupled to the opposite end of the emitter resistor, the output terminal of the potentiometer being coupled to the collector output terminal so that (a) when the wiper is adjacent the emitter terminal the emitter resistor is effectively shunted by a low resistance thereby increasing the gain of the transistor stage while the output terminal is substantially free of shunting effect for maximizing the output signal and so that (b) when the wiper is adjacent the potentiometer output terminal the stage output terminal is effectively shunted by a low resistance and the emitter resistor is substantially free of shunting effect for decreasing the gain of the transistor stage and minimizing the output signal, and a capacitor in the circuit which includes the emitter terminal and wiper so direct emitter current is prevented from flowing through the wiper.

2. The combination as claimed in claim 1 in which a low value limiting resistor is effectively interposed in series with the emitter terminal of the potentiometer to insure that a certain minimum resistance is always in the emitter circuit even when the potentiometer slider is in its adjacent end position thereby to limit the maximum gain of the stage to a reasonable level.

3. In an input amplifier stage for a microphone, the combination comprising a transistor having a base, emitter and collector, a direct current source, means for coupling a microphone to the base, a load circuit including a load resistor in series with the collector and an emitter resistor in series with the emitter, a stage output terminal coupled to the collector, a volume control potentiometer having emitter and output terminals and a wiper, the emitter terminal being coupled to the emitter end of the emitter resistor, the wiper being coupled to the opposite end of the emitter resistor, the output terminal of the potentiometer being coupled to the collector output terminal so that (a) when the wiper is adjacent the emitter terminal the emitter resistor is effectively shunted by a low resistance thereby increasing the gain of the transistor stage while the output terminal is substantially free of shunting effect for maximizing the output signal and so that (b) when the wiper is adjacent the potentiometer output terinal the stage output terminal is effectively shunted by a low resistance and the emitter resistor is substantially free of shunting effect for decreasing the gain of the transistor stage and minimizing the output signal, and a relatively low value resistor and high value capacitor effectively in series with the wiper.

4. In an input amplifier stage for a microphone, the combination comprising an NPN transistor having a base, emitter and collector, a direct current source, means for coupling a microphone to the base, a load circuit including a load resistor in series with the collector and connected to the positive side of the current source and an emitter resistor connected to ground, a stage output terminal coupled to the collector, a volume control potentiometer having emitter and output terminals and a wiper, the emitter terminal of potentiometer being coupled to the emitter and the wiper being coupled to ground, the output terminal of the potentiometer being coupled to the stage output terminal so that (a) when the wiper is adjacent the emitter the emitter resistor is effectively shunted by low resistance thereby increasing the gain of the transistor stage while leaving the output terminal substantially free of shunting effect for maximizing the output signal and so that (b) when the wiper is adjacent the output terminal the stage output is effectively shunted by a low resistance while leaving the emitter resistor substantially free of shunting effect for decreasing the gain of the transistor stage and minimizing the output signal, a relatively low value limiting resistor effectively interposed in series with the emitter terminal of the potentiometer, and a high value capacitor effectively interposed in series with the wiper to prevent flow of direct current therethrough from the emitter while providing a low impedance to flow of the audio signal.

5. In an input amplifier stage for a microphone the combination comprising a solid state amplifying device having an input circuit and a load circuit, a direct current source, the load circuit including a load resistor and a gain determining resistor arranged in series across the current source and having their inner ends connected to the amplifying device, a stage output terminal coupled to the inner end of the load resistor, a volume control potentiometer having first and second terminals and a wiper, the first terminal of the potentiometer being coupled to the inner end of the gain determining resistor, the wiper being coupled to the outer end of the gain determining resistor, the second terminal of the potentiometer being coupled to the stage output terminal so that (a) when the wiper is adjacent the first terminal of the potentiometer the gain determining resistor is effectively shunted by low resistance thereby increasing the gain of the amplifier stage while leaving the stage output terminal substantially free of shunting effect for maximizing the output signal and so that (b) when the wiper is adjacent the second terminal of the potentiometer the stage output terminal is effectively shunted by a low resistance while leaving the gain determining resistor substantially free of shunting effect for decreasing the gain of the amplifier stage and minimizing the output signal, and a high value capacitor effectively interposed in series with the wiper to prevent flow of direct current therethrough from the amplifying device while providing a low impedance to flow of the audio signal.

6. In an input amplifier stage for a microphone the combination comprising a solid stage amplifying device having an input circuit and a load circuit, a direct current source, the load circuit including a load resistor and a gain determining resistor arranged in series across the current source and having their inner ends connected to the amplifying device, a stage output terminal coupled to the inner end of the load resistor, a volume control potentiometer having first and second terminals and a wiper, the first terminal of the potentiometer being coupled to the inner end of the gain determining resistor, the wiper being coupled to the outer end of the gain determining resistor, the second terminal of the potentiometer being coupled to the stage output terminal so that (a) when the wiper is adjacent the first terminal of the potentiometer the gain determining resistor is effectively shunted by low resistance thereby increasing the gain of the amplifier stage while leaving the stage output terminal substantially free of shunting effect for maximizing the output signal and so that (b) when the wiper is adjacent the second terminal of the potentiometer the stage output terminal is effectively shunted by a low resistance while leaving the gain determining resistor substantially free of shunting effect for decreasing the gain of the amplifier stage and minimizing the output signal, and a relatively low value resistor interposed effectively in series with the first terminal of the potentiometer for limiting the maximum gain of the amplifier to a reasonable level when the wiper is adjacent the first terminal of the potentiometer.

7. In an input amplifier stage for a microphone the combination comprising a solid stage amplifying device having an input circuit and a load circuit, a current source, the load circuit including a load resistor and a gain determining resistor arranged in series across the current source and having their inner ends connected to the amplifying device, a stage output terminal coupled to the inner end of the load resistor, a volume control potentiometer having first and second terminals and a wiper, a capacitor, the first terminal of the potentiometer being coupled by the capacitor to the inner end of the gain determining resistor, the wiper being coupled to the outer end of the gain determining resistor, the second terminal of the potentiometer being coupled to the stage output terminal so that (a) when the wiper is adjacent the first terminal of the potentiometer the gain determining resistor is effectively shunted by low resistance thereby increasing the gain of the amplifier stage while leaving the stage output terminal substantially free of shunting effect for maximizing the output signal and so that (b) when the wiper is adjacent the second terminal of the potentiometer the stage output terminal is effectively shunted by a low resistance while leaving the gain determining resistor substantially free of shunting effect for decreasing the gain of the amplifier stage and minimizing the output signal, and a relatively low value resistor and high value capacitor being interposed effectively in series with the first terminal of the potentiometer.

8. In an input amplifier stage for a microphone the combination comprising a solid stage amplifying device having an input circuit and a load circuit, a direct current source having a point of reference, the load circut including a load resistor and a gain determining resistor arranged in series across the current source and having their inner ends connected to the amplifying device, a stage output terminal coupled to the inner end of the load resistor, a volume control potentiometer having first and second terminals and a wiper, the first terminal of the potentiometer being coupled to the inner end of the gain determining resistor, the wiper being coupled to the point of reference, the second terminal of the potentiometer being coupled to the stage output terminal so that (a) when the wiper is adjacent the first terminal of the potentiometer the gain determining resistor is effectively shunted by low resistance thereby increasing the gain of the amplifier stage while leaving the stage output terminal substantially free of shunting effect for maximizing the output signal and so that (b) when the wiper is adjacent the second terminal of the potentiometer the stage output terminal is effectively shunted by a low resistance while leaving the gain determining resistor substantially free of shunting effect for decreasing the gain of the amplifier stage and minimizing the output signal, and a high value capacitor effectively interposed in series with the wiper to prevent flow of direct current therethrough from the amplifying device while providing a low impedance to flow of the audio signal.

9. The combination as claimed in claim 8 in which the potentiometer is tapered beyond logarithmic with a resistance ratio, with wiper at midpoint, of less than 10/90.

10. The combination as claimed in claim 5 in which a series output resistor and capacitor are connected between the inner end of the load resistor and the stage output terminal so that when the wiper is adjacent the second terminal of the potentiometer a large drop in signal voltage occurs in the output resistor to insure reduction of the output signal to zero.

* * * * *